United States Patent [19]
Sandvos et al.

[11] Patent Number: 5,490,275
[45] Date of Patent: Feb. 6, 1996

[54] VIRTUAL RADIO INTERFACE AND RADIO OPERATING SYSTEM FOR A COMMUNICATION DEVICE

[75] Inventors: Jerry L. Sandvos, Davie; Timothy A. Monahan-Mitchell, Deerfield Beach; Karl R. Weiss, Plantation, all of Fla.

[73] Assignee: Motorola, Inc., Schaumburg, Ill.

[21] Appl. No.: 383,556

[22] Filed: Feb. 1, 1995

Related U.S. Application Data

[63] Continuation of Ser. No. 906,969, Jun. 30, 1992, abandoned.
[51] Int. Cl.$^6$ ........................................... G06F 9/00
[52] U.S. Cl. ................ 395/700; 395/500; 455/84; 364/DIG. 2
[58] Field of Search ............... 395/500, 650, 395/700, 800; 455/84

[56] References Cited

U.S. PATENT DOCUMENTS

| | | |
|---|---|---|
| 4,475,156 | 10/1984 | Federico et al. |
| 4,637,022 | 1/1987 | Burke et al. |
| 5,001,666 | 3/1991 | Thompson et al. |
| 5,060,140 | 10/1991 | Brown et al. |
| 5,060,150 | 10/1991 | Simor. |
| 5,249,270 | 9/1993 | Stewart et al. .................. 395/200 |

OTHER PUBLICATIONS

R. C. Holt, *Concurrent EUCLID, The UNIX System, and TUNIS*, Addison–Wesley, 1983, pp. 213–241.
S. W. Roggow, "Software Architecture for a Miniature Radio System," MILCOM 90. A New Era, 1990 IEEE Military Communications Conference, vol. 3, pp. 1054–1057.
Glenn Krasner, "The Smalltalk–80 Virtual Machine," BYTE, Aug. 1981, pp. 300–320.

*Primary Examiner*—William M. Treat
*Attorney, Agent, or Firm*—M. Mansour Ghomeshi

[57] ABSTRACT

A communication device (100) includes three levels and at least one feature and at least one protocol for communicating with other communication devices. The three levels are high level or user ergonomics (302), common level or feature/protocol (310), and low level or hardware platform (318). The feature/protocol level (310) is adapted for controlling the at least one feature and the at least one protocol. The user ergonomics (302) includes a first interface (304) coupled to the feature/protocol level (310) for allowing the user ergonomics level (302) to change without affecting the feature/protocol level (310). The, hardware platform (318) includes a second interface coupled to the feature/protocol level (310) for allowing the hardware platform (318) to change without affecting the feature/protocol level (310) or the user ergonomics level (302).

12 Claims, 5 Drawing Sheets

VIRTUAL RADIO INTERFACE AND RADIO OPERATING SYSTEM FOR A COMMUNICATION DEVICE

This is a continuation of application Ser. No. 07/906,969, filed on Jun. 30, 1992 and now abandoned.

TECHNICAL FIELD

This invention is related in general to micro-processor embedded radio communication devices and more particularly to the architecture and the operating system of the micro-processors used in these devices.

BACKGROUND

Computers typically execute a series of tasks suitable for an intended application. A "task" is defined as a self-contained package of data and executable procedures which operate on that data, perform logical functions, and are comparable to a "process" in other known systems. In an operating system environment, the Operating system provides housekeeping, or direct control of the processes or tasks within the software package. The process, or task, is typically made up of one or more subroutines.

Within a process, it is desired that the data be accessible only by that process and not be accessed from the outside, i.e., by other processes. Processes can be used to implement "objects", "modules", or other higher-level data abstractions. In communication devices, where features, controls, and hardware platforms commonly change from one family of products to another, it is desired to have a fully portable process in which objects, modules, and higher-level data abstractions can be transferred from one design to another without significant design overhead.

In the prior art, one known system comprises a multiple tri-level micro-processor radio operating system that provides a background executive to allow processing of time-insensitive tasks. A foreground routine allows processing of real-time sensitive tasks. And finally, a midground executive is utilized to allow processing of time-sensitive tasks. A problem with such a system is that all the segments are so interdependent that every time a segment is changed others will have to inevitably change as well. Changes, therefore, had a tendency to be postponed in view of significant cost disadvantages that where associated with having to redesign unrelated areas in order to render the individual segments inter-operative. Furthermore, these systems heavily depend on the time sensitivity of the task and hence will provide support on the basis of their timing sensitivity to the overall operation of the device.

Instead of being based on time sensitivity implemented by interrupts, operating systems based on message passing were developed. In these operating systems, messages are used by two processes to exchange data, or otherwise communicate. Messages also provide the mechanism by which hardware transparency is achieved. A process located anywhere in the system may now send a message to any other process anywhere else in the system if it knows the process name. This approach, although solving some problems with architectures, did not provide portability of the architecture.

Accordingly, there exists a need for an architecture for use in a variety of communication devices that reduces design time and increases design efficiency by utilizing a common architecture with various platforms and ergonomics for all new radio products.

SUMMARY OF THE INVENTION

Briefly, according to the invention a communication device having at least one feature and at least one protocol for communicating with other communication devices is disclosed. The communication device includes three means; a feature/protocol means, a user ergonomics means, and a hardware platform. The feature/protocol means is adapted for controlling the at least one feature and the at least one protocol. The user ergonomics means includes a first interface coupled to the feature/protocol means for allowing the user ergonomic means to change without affecting the feature/protocol means. The hardware platform includes a second interface coupled to the feature/protocol means for allowing the hardware platform to change without affecting the feature/protocol means or the user ergonomics means.

DETAILED DESCRIPTION OF THE PREFERRED EMBODIMENT

Figure 1:
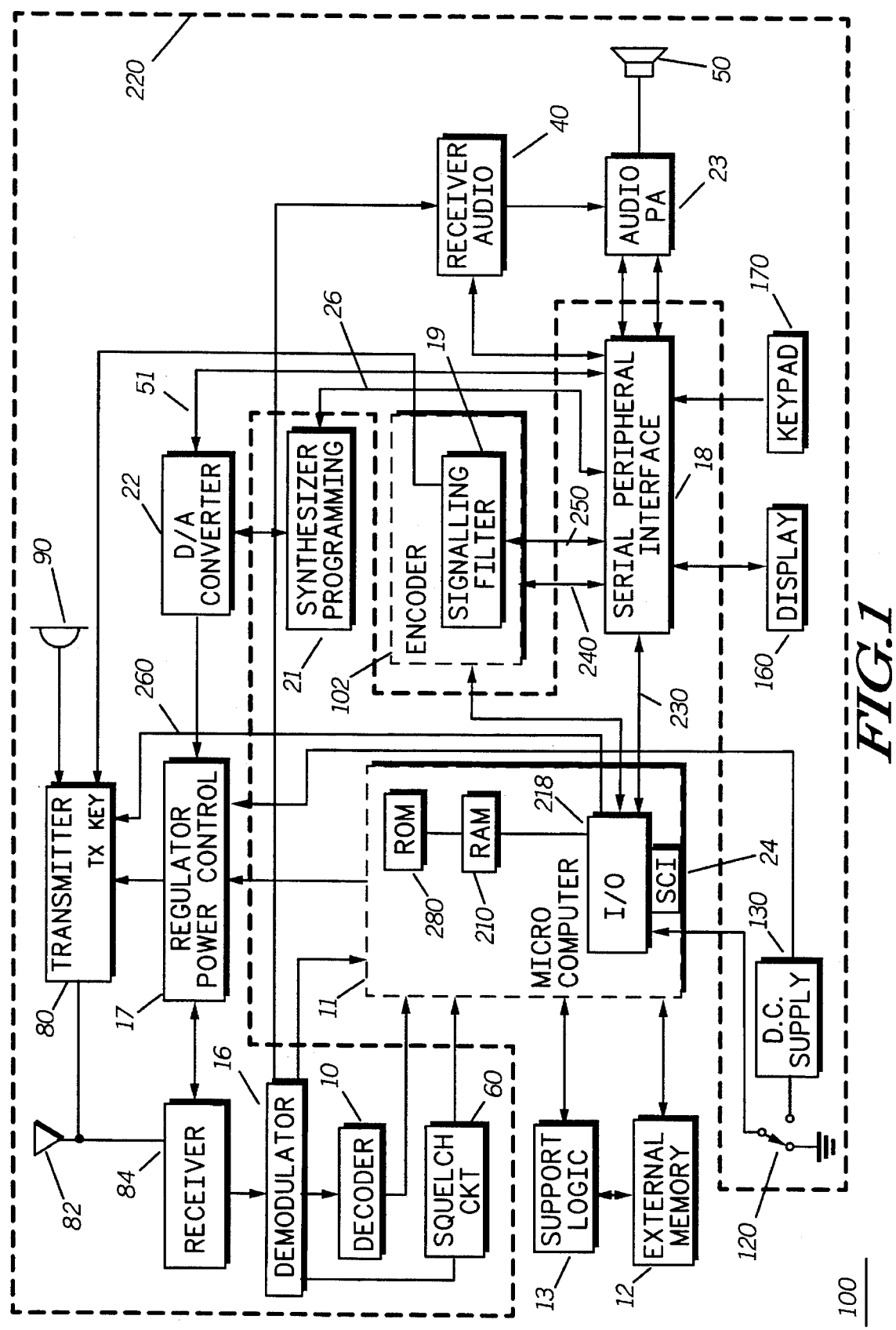
FIG. 1 is a block diagram of a micro-processor controlled two-way radio communication device, in accordance with the present invention.

Referring to FIG. 1, a radio communication device 100, such as a two way radio, in accordance with the present invention is shown. The device 100 includes a microprocessor or micro-computer 11 (such as an MC68HC11, manufactured by Motorola, Inc.) connected to various radio hardware components or hardware 220 and other logic units. The micro-computer 11 includes internal memory components containing read only memory (ROM) 280 and random access memory (RAM) 210, an input/output (I/O) interface 218 and a serial communications interface (SCI) or a low level serial bus handler 24. The other logic components may include an external memory 12 and a support logic 13 as understood in the art. In the preferred embodiment, the ROM 280 requires a minimum of 32 kilobytes and the RAM 210 requires a minimum of 8 kilobytes. Memory mapping is preferably available to the micro-computer 11 and hence the virtual ROM space available may be considerably larger than the 64 kilobytes.

Figure 2:
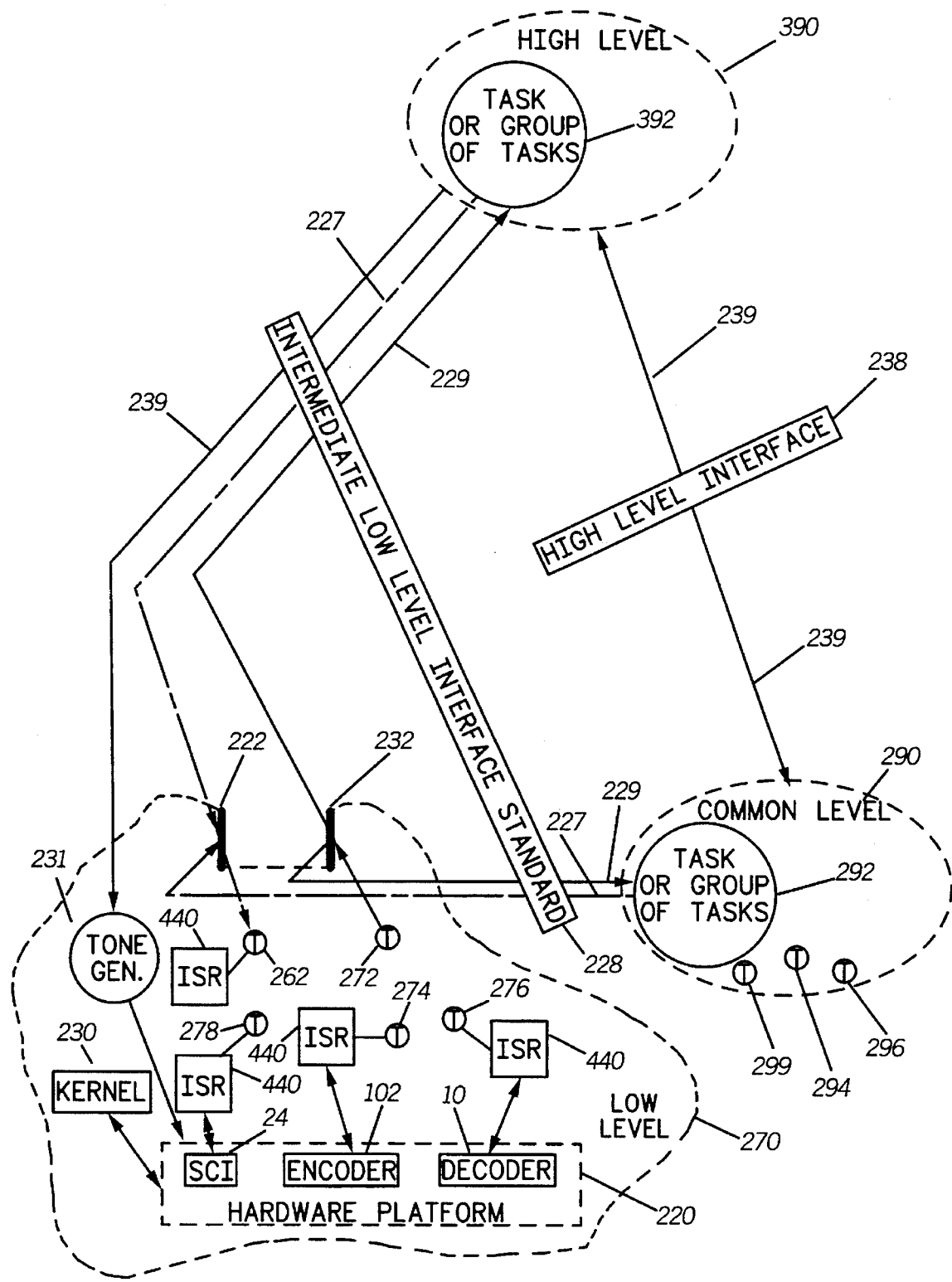
FIG. 2 shows the control architecture for controlling the radio communication device of FIG. I in accordance with the present invention.
Figure 3:
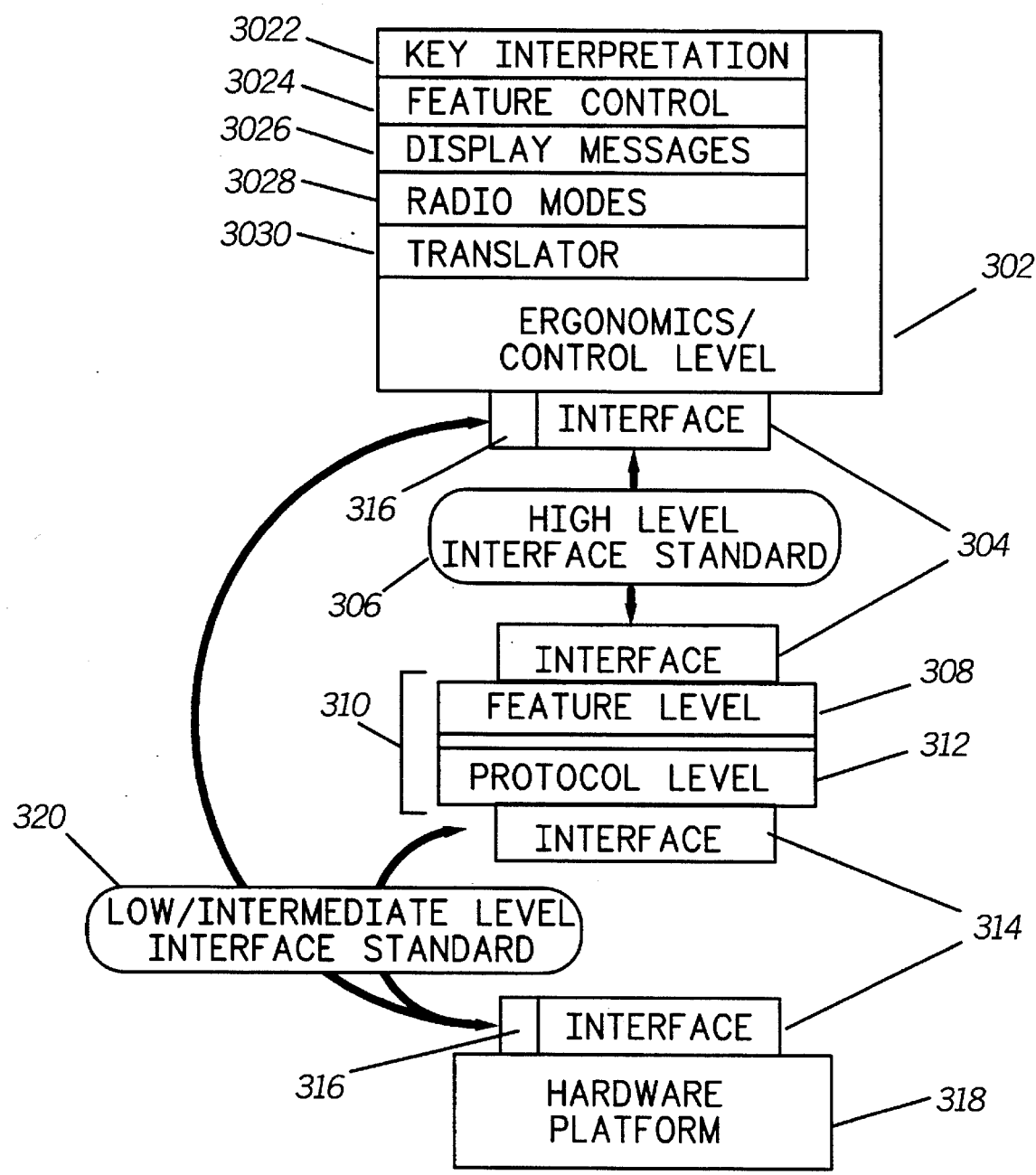
FIG. 3 is an alternative illustration of the control architecture diagram of FIG. 2.

An overview of the Virtual Radio Interface Standard (VRIS) is presented here to facilitate the understanding of the principles of the present invention. Details of the various components of this standard will follow. In general, VRIS defines a standard interface between the software and the hardware inside a radio communication device. As such, VRIS defines a set of procedures, methods, and rules, called services, which are used to develop various radio communication features and/or user requirements. If the radio communication features and/or user requirements are developed using VRIS, the effort to move the features and/or user requirements to a new platform (hardware) should be limited to developing only services to access the new hardware in a manner compatible with the defined standard. Recognizing the uniqueness of user interfaces among radio communication devices, VRIS also defines an ergonomic interface to partition the user interface unique code from that code which is common among platforms. FIGS. 2 and 3 discuss the features of the VRIS and its various levels and interfaces.

In the preferred embodiment, VRIS does not specify what the actual memory map and/or model should look like, however it does place some constraints on the choices available. The most prominent is that there should be a common section of the ROM 280 that is continuously available, or mapped in. For performance reasons, this should be a large block, greater than 16K bytes and preferably 32K bytes. This is necessary to support the kernel 230 and, at a minimum, the entry addresses and a map routine for each service call defined in the radio interface standard.

The communication device 100 also includes a receiver 84 which receives a radio frequency signal from an antenna 82 and couples it to an RF demodulator 16 for recovery. The coupling of the antenna 82 to the receiver 84 may be implemented via an antenna switch, not shown. Antenna switches are commonly used in communication devices to selectively couple the antenna to a transmitter or a receiver. The recovered signal of the demodulator 16 is fed into the micro-computer 11 and a decoder 10. The decoder 10 can decode either digitally-modulated data, such as trunking Outbound Signaling Word (OSW) information or analog data, such as Dual Tone Multiple Frequency (DTMF). Alternately, these decode functions can be performed directly by the microcomputer 11. A signal from the demodulator 16 is coupled to a squelch circuit 60 which provides the micro-computer 11 with carrier detect information.

The demodulated signal of the demodulator 16 includes a first standardized format that would fall under any one of the protocols handled by the feature/protocol level 310 of FIG. 3. The output of the demodulator 16 is coupled to a segment of the micro-computer 11 associated with the feature/protocol level 310 via a decoder 10. At the feature/protocol level 310, the standardized format of the demodulated information signal is processed to produce a control signal and a second signal having yet a second standardized format. This second signal is coupled to an ergonomics/control level 302 via a second interface 304 and high level interface standard 306. At the ergonomics/control level 302, the second standardized format of this second signal is processed to produce the information signal transmitted by the second communication device.

On the transmit side, the transmitter 80 is coupled to the antenna 82 via an antenna switch or any other coupler known in the art. Inputs to the transmitter 80 may arrive from two sources: a microphone 90 or a data encoder 102. The transmitter 80 modulates a carrier signal using these input signals and prepares it for transmission on a radio frequency communication channel. Alternatively, the encoder 102, including its signaling filter 19, provides for a modulator that is coupled to the user ergonomic level 302 via the serial peripheral interface 18. The transmitter 80 is enabled by a Tx enable signal from the micro-computer 11. In the transmit path, information signals, locally generated by the micro-computer 11, are coupled to the encoder 102 under the control of the serial peripheral interface 18. The ergonomics/control level 302, using the interface level 304 and the high level interface standard 306, is coupled to the feature/protocol level 310. At the feature/protocol level 310 the protocol of the information signal is converted before it is interfaced to the hardware platform 318 for transmission via the transmitter 80.

The micro-computer 11 also controls the data encoder 102 by providing it with an enable signal, via the serial peripheral interface 18. In the preferred embodiment, a normally-grounded momentary switch 120, commonly called Push-to-Talk (PTT), is used to request transmission. Actuation of the switch 120 connects a logic high, generated by a DC supply 130 to an I/O port 218 in the micro-computer 11 which in turn provides the transmitter 80 with a transmit enable signal. Although, the decoder 10 and the encoder 102 are shown as two separate blocks in the radio hardware platform 318, it is well understood in the art that they may be combined to produce an interface capable of providing both decoding and encoding functions of the demodulated and the information signal.

In addition, a regulator power control 17 is coupled to the DC supply 130 and provides appropriate power levels to various components of the radio communication device 100. The regulator power control 17 receives a control signal from the D/A converter 22. The digital signal to the D/A converter 22 is supplied via the Serial Peripheral Interface (SPI) 18 on a signal line 51. As stated earlier, the input to the SPI 18 is supplied from the micro-computer 11 via line 230.

Basically, the serial peripheral bus 230 is used to establish communications between the radio hardware and peripheral-devices such as a display 160 for the display of information and a keyboard or keypad 170 for the entry of data and control information. The serial peripheral bus 230 is also used for external communications via a connector on the outside of the radio communication device 100. The radio communication device 100 has all operator and accessory selectable controls accessible via this external serial bus 230 to provide flexibility for future expansions. The serial bus 230 is a physical medium through which data is transmitted and received from the outside world. It is the function of the serial communications interface 24 to provide the physical interface to the serial bus information.

The micro-computer 11 directly interfaces to the radio hardware 220 and performs many of the low-level tasks associated with a particular radio. These tasks may include synthesizer control 21, transmit power level control 17, audio muting 40, channel scanning logic 26, receive/transmit and transmit/receive sequence timing 260, and sub audible signaling generation and detection 250.

So configured, the micro-computer 11 receives information regarding the functioning of the radio and greatly influences the mode of operation of the radio. For example, in a trunked communication application or mode, the micro-computer 11 provides the necessary software resources to allow interaction with the trunked control center's channel assignment and channel maintenance information, along with other signaling. On the other hand, in conventional radio operation, the micro-computer 11 will support channel scanning activities, priority channel scan activities, and other signaling responsibilities, as may be appropriate.

The tasks within the radio software are controlled or scheduled by the operating system within the micro-computer 11. In the software operating environment according to the present invention, the software operating system is a Radio Operating System (ROS) developed and optimized for the Motorola micro-processor MC68HC11. This operating system is specifically designed for radio applications to achieve better modularity and to promote reuse. The operating system overlies the control architecture of the present invention and, in general, acts as a manager, or scheduler, for the tasks in the system. In the ROS physical code object model, the system configuration is based on tasks and task communications are accomplished via simple message models. A "message" is a fixed-length buffer containing data which controls a process and/or supplies that process with information it needs to carry out its operation. Hence, the buffer carries information, parametric data, or arguments between processes or tasks. In the message, a header contains the sender's identification (ID), to inform the receiving tasks as to where the message originated, for the receiving task to properly interpret the data within.

Messages that are sent to a process or task are queued in a first-in-first-out (FIFO) type message queue. There exists a priority queuing mechanism where priority messages get automatically placed at the front of the receiver's message queue.

Every process or task has a unique identifier known as the "task ID" by which it can be referenced. The ID is assigned by the operating system when the process is created, and it is used by the operating system to physically locate the process. Every process or task in the system will have a unique task ID. Messages are directed to a task by referencing the task ID. More specifically, the task ID is a pointer to the task node (or the task control block in RAM 210). There also exists a unique task name for each task which uniquely identifies the task or process. The operating system provides a task name to task ID translation.

Referring to FIG. 2, a three layer standard based on the functionality of VRIS in accordance with the invention is illustrated. A dashed line implies a separation between one of the VRIS layers, with the choices of layers being low 270, high 390, and common 290. A layer is simply a collection of related processes, or tasks (for example 272, 282, and 392).

A circle implies a ROS task, or a set of ROS tasks, allowing a hierarchical representation of the system. Thus, the layers partition the tasks into smaller, more manageable subsystems. The related tasks perform functions that are comparable in terms of level of abstraction or functionality.

In the three-layer standard based on the functionality of VRIS, the hardware routines, such as synthesizer programming 21, and time critical functions such as the hardware interfacing (274, 276, 278) for the encoder 102, the decoder 10, and the serial bus handler 24, respectively, form the low level VRIS 270. Hence, examples of low level tasks are serial bus command interpretation 278, and other tasks interfacing the hardware platform 220 such as keypad scanning 170, audio routing 40, and synthesizer programming 21.

Recognizing the uniqueness of user interfaces among radio products, the VRIS standard defines a control or model unique ergonomics level as the high level VRIS 390. The high level VRIS layer is responsible for the user ergonomics of the radio, such as key board functionality, volume control, emergency key, etc.

The rest of the tasks 292, namely, the various radio features, user requirements, and communications protocols, that are radio independent, or historically stable, are grouped in the common level VRIS 290. Hence, examples of common level tasks are the software interfacing for signal encoding 294 and decoding 296, and tone generation requests 299. These requests are routed to the tone generator 231 in the low level 270 where they are generated.

Tasks that respond to an operator input are further separated into hardware dependent data sourcing tasks 272, such as the sensing of the closing of a switch by the operator, located in the low level 270, and hardware independent data receiving tasks 392, such as executing the radio operation selected by the operation in response to receiving the pressed switch information, located in the high level 390.

Generally, sources and sinks are generators and consumers, respectively, of asynchronous data that is created by the radio software during its operation. Specifically, VRIS functionally defines a virtual source or a hardware dependent data sourcing task 272, as a method for collecting and distributing data generated in an asynchronous manner. This data includes external data that comes in from the outside world such as any over-the-air signaling data (10), some forms of internally generated radio information such as receive and transmit state indications, and the already mentioned user inputs, exemplified by key presses on user buttons or switch changes. This data is captured by the hardware dependent platforms 220 of the low level VRIS.

Virtual sources then provide a mechanism to receive low level information independent of the actual hardware that exists in the radio platform. Furthermore, the virtual sources provide a means for other tasks to receive copies of the low level information and to stop receiving these copies on request. This mechanism of receiving copies is referred to as subscribing to a virtual source. Copies of the low level information are sent out via ROS messages to all tasks in a subscriber list. A virtual source performs the collecting of the asynchronously received data. In some cases, the low level VRIS will further process the data into a more useful form before it is distributed. Thus, the different types of data are collected logically into a set of virtual sources.

According to the VRIS standard, a process or task, at the common or high level, cannot directly communicate with tasks in the low level. All communications to and from the low level tasks are done within the low level VRIS definition which provides a logical interface that hides the actual implementation of the low level from the rest of the software. Thus, separating the high 390 and common 290 levels from the low level is a low level interface 228.

Expanding the separation between layers, a high level interface 238 is also illustrated, separating the high level 390 from the common level 290. The benefit of having multiple interfaces is improved partitioning which promotes the reusability of code.

The interfaces 228 and 238 are pre-defined sets of functions and/or message formats which allow a task to be designed and written independently of other tasks in the system. Making up the high level interface 238 is a pre-defined set of ROS message formats 239, which allow the tasks on either side of the interface to communicate with each other. Notationally, solid lines with arrowheads 239 joining the tasks imply that ROS messages are sent from one task to another.

The low level interface 228 includes a predefined set of ROS message formats 229 that are defined by each of the individual virtual sources. Additionally, the low level interface 228 also includes a pre-defined set of VRIS function calls 227 which allow the tasks on the high and common level side of the interface to communicate information to the low level. Notationally, function calls 227 are represented by hyphenated lines.

Thus, by formalizing and standardizing the interface definitions, a task in the high level or common level can be written using the interface definition independent of the existing hardware platform. The newly designed task then becomes independent of exactly how the low level is implemented. This high degree of independence provides better reuse of the software on each side of the interface.

The low level hardware interface 228 then provides the set of software services used by the ergonomics (high level) 390 and features (common level) 290 levels, or layers, to communicate with and control the hardware platform 220. If the various radio features and user requirements are developed using the set of standard procedures, methods, and rules, namely low level VRIS services, the effort to change the features or user requirements to accommodate a new radio product would be limited to developing only the services, for example, a low level call, to access the new hardware in a manner compatible with the defined standard. Function calls 227, adhering to the VRIS standard for form and interface, are the software routines capable of performing specific radio functions through the use of radio-independent software which may be used in conjunction with ISR/drivers 440 (or switch sensors) and/or services 222.

Notationally, a dark vertical bar implies the representation of the low level (LL-VRIS) service which is part of the low level interface 228. The part of the low level VRIS interface with a hyphenated line going into it is then a "sink". A LL-VRIS service can be a sink 222, which implies that one of the corresponding LL-VRIS functions was called by a task in the high 390 or common 290 levels. The low level 270, containing the specific radio tasks, is thus controlled from common and/or high level calls 227. Obviously, the low level services must be visible to all the other calling functions from the common and high levels. The low level virtual source services which generate ROS messages 232, in response to the function calls by the sinks, are represented by dark vertical bars with a solid arrow emanating from each of them.

To better understand the principles of the present invention, an alternate approach is taken in describing the preferred embodiment of the interface mechanism between the various levels of the radio communication device 100. This approach is presented in FIG. 3 where multiple layers of the communication device 100 are shown. These layers are identified with different reference number in order to avoid confusion in overlapping areas. In general, both FIGS. 2 and 3 depict the VRIS interface in accordance with the present invention. They both include multiple of layers along with interfaces and interface standards. The definitional approach is different between them in order to provide a better understanding of the invention.

The architecture shows three levels, a hardware platform 318, a feature/protocol level 310, and an ergonomics/control level 302. These levels correspond with the low, common, and high levels, previously discussed. The architecture includes three interfaces or data translators: 304, 314, and 316. Interconnecting these three interfaces are two interface standards 306 and 320 which standardize the communication between the interfaces, hence the three levels 302, 310, and 318. The high level interface 304 provides the first standardized interface 306 between the ergonomics/control level 302 and the feature/protocol level 310. The low level interface 314 provides the low/intermediate level interface standard 320 to interface the feature/protocol level 310 to the hardware platform 318. The interface standard 320 is used by the intermediate interface 316 to provide the interface between the hardware platform 318 and the ergonomics/control level 302. These various interfaces and interface standards render the three levels 302, 310, and 318 portable. In other words, any of the levels 302, 310, and 318 may be replaced with another at this level, so long as the interfaces are maintained and adhered to. This portability affords the communication device 100 the ability to have any of its various levels changed without requiring changes to other levels. In other words, a level, namely hardware platform 318, may change to meet new operating requirements. The new hardware platform will include appropriate interfaces to the low and intermediate level 314 and 316, allowing it to communicate to the feature/protocol level 310 and the ergonomics/control level 302 without requiring these two levels to undergo similar changes.

Some of the functions of the feature/protocol level 310 include the interaction of signaling feature within a single signaling scheme and feature set that are radio independent. For instance, it may be desired that while in "Emergency mode", the radio will not respond to "Call Alerts" directed to it. This function is provided through the feature/protocol level 310.

Another function of the feature protocol level 310 is the generation of momentary tone for historically stable ergonomics of signaling events. The high level 302 is aware of what momentary signaling tones will be handled by the common level 310, even though additional, radio specific, ergonomic feedback may also be required, e.g., when the radio unmutes on a priority channel while scanning, the common level 310 will sound a beep.

Yet another function of the feature/protocol level 310 is to provide enough run-time configuration options, controls, and outputs to present a fixed interface to the high level 302. This has historically allowed a different radio ergonomics and anticipated new radio ergonomics to accomplish unique, but similar, ergonomic requirements, e.g., the phone feature must provide an interface that allows automatic phone channel access on function entry followed by "live dial" of DTMF, or a "pre-dial" form of ergonomics where the user prepares the number to dial, then channel access and dialing is handled automatically after the user enters the number.

The use of interfaces 304, 314, and 316, and interface standards 306 and 320 greatly facilitates the task of changing various levels in the communication system 100. It is no longer necessary to alter the entire architecture of a communication device when a portion must undergo changes to meet specific operating demands or characteristics.

Some of the functions performed by the ergonomics/control level 302 include the ergonomics of displays, visual indicators, mechanical switches, and audible tones for the radio 100. Another function of the level 302 is the functionality to control the feature/protocol level 310 to accomplish what the user desires, based on the ergonomic input.

The ergonomics/control level 302 also provides the functionality to provide visual and/or audible feedback based on combining events and conditions from the feature/protocol Layer 310 with ergonomic state information and other high level ergonomic rules or conditions. Ergonomic rules or conditions that define the interaction of features within one signaling protocol feature set, or across signaling protocol feature sets, that inherently depend on radio specific ergonomic definition are also handled by the level 302.

The high level interface standard 306 provides the communication standard used by the interface 304 of the ergonomics/control level and the feature/protocol level, respectively. This interface standard 306 may be viewed as an intermediary between levels 302 and 310. This interface standard 306 should be maintained at the interface level 304 of each of these levels 302 and 310 when changes are deemed necessary to either one of the two levels 302 and 310. By maintaining the integrity of the interface standard 306, changes to the ergonomics/control level 302 may be implemented without having any effects on the feature/protocol level 310 and vise-a-versa.

Similarly, the interface standard 320 acts as an intermediary between the hardware platform 318 and the feature/protocol level 310 and the ergonomics/control level 302, via their respective interfaces. Once again, changes to any one of the three levels 302, 310, and 318 may be implemented without requiring changes to the others so long as the interface standard 320 is maintained and interfaces 314 and 316 remain unchanged. This is highly significant because it reduces unnecessary development time and resources in redesigning various components when only a portion requires modification.

As it can be seen, the ergonomics/control level 302 includes key interpretation 3022, feature control 3024, display messages 3026, radio modes 3028, and translator 3030. These blocks provide the various functions of the ergonomics/control level 302. At the key interpretation 3022, decoders are used to determine key entries by the user. In the preferred embodiment, the micro-computer 11 provides decoding of keypad entries. The keypad 170 is coupled to the micro-computer 11 via the serial peripheral interface 18 and the bus 230.

At the feature/control 3024, specific features that are implemented in a particular communication device are controlled. The feature/control 3024 provides the user with the ergonomics of using the features offered by the feature/protocol level 310. The display messages block 3026 provides the means for displaying information on the display 160. Incoming data, keypad entries requiring display, and alerts are some of the information requiring display. The radio modes 3028 allow the radio to operate in one of several modes, such as conventional or trunking. These radio modes are indeed the operating modes of the radio communication device 100 and may be different from one device to the next. The translator 3030 is used for translating or interpreting the locally generated information to the high level interface standard 306 suitable for communication to the feature/protocol level 310 via the interface 304. The translator 3030 is also used to translate the ergonomics/control level information to the low level interface standard 320 for interface to the hardware platform 318 via the interface 316.

Note that blocks 3022, 3024, 3026, and 3028 are some of the several options available to a user through the ergonomics/control level 302. The tasks associated with the ergonomics/control level 302 are performed via blocks 3022, 3024, 3026, and 3028. The introduction of these blocks is for the purpose of discussing the preferred embodiment of the present invention, and hence shall not be construed as limitations thereof. It is understood that additional options may be added as necessary without departing from the spirit of the invention. Furthermore, it is noted that the hardware platform 318 provides the transportable decoder means of the present invention.

Figure 4:
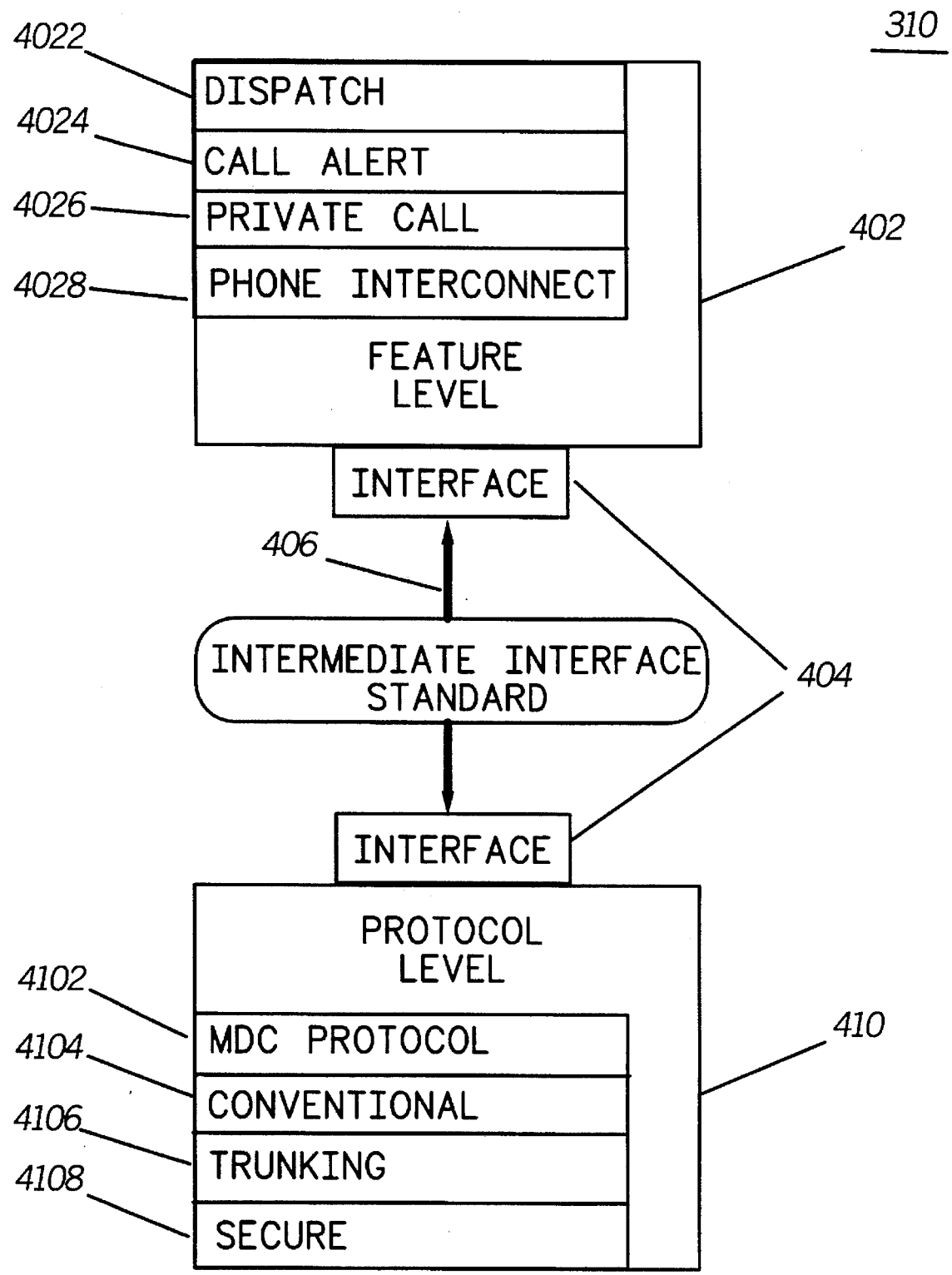
FIG. 4 is a block diagram of the elements of the feature and protocol level in accordance with the present invention.

Referring now to FIG. 4, the internal elements of the feature/protocol level 310 in accordance with the present invention are shown. In general, two sub-levels, a feature level 402 and a protocol level 410 are shown. A second intermediate interface 404 is used along with a third interface standard 406 to interface and provide communication between the sub-levels 402 and 410. The second standardized interface 404 allows, once again, the protocol level 410 or the feature level 402 to change without affecting the other. The feature level 402 includes a plurality of tasks which are implemented using one or more of several internal blocks. These blocks includes dispatch 4022, call alert 4024, private call 4026, and phone interconnect 4028. Other elements needed for additional tasks may be added to the feature level 402, as needed.

The task implemented by the phone interconnect 4028, as the name implies, is to provide the user with the ability to interconnect with a phone system thereby allowing phone communications to be conducted on the radio communication device 100 using radio frequency communication channels. The private call 4026 is used for allowing private call communication between the radio communication device 100 and other similar products. Call alert 4024, on the other hand, allows a second communication unit to page the communication unit 100. This feature provides the user with the ability to answer the page at his convenience as opposed to having to immediately respond to the incoming call as is the case with the private call feature.

The protocol level 410 similarly includes a plurality of tasks implemented by one or a combination of the MDC protocol block 4102, the conventional block 4104, the trunking block 4106, and the secure block 4108. The protocol level 410, as its name implies, is responsible for formulating the protocols used in the communication of the communication device 100 with other devices. Secure block 4108 provides for secure communication between communication devices and the radio communication device 100. MDC protocol is a Motorola-developed protocol for data communication between mobile and portable radio products. Conventional and trunking protocols are well known in the art. The earlier is used by communication devices without the use of a central controller. The latter, however, uses a central controller to control and process calls between units.

In summary, it has been shown that the feature/protocol level 310 may alternately include a feature level and a protocol level, both of which are coupled to each other via a second intermediate level interface that provides a third standardized interface. This standardized interface allows changes to either one of the feature or the protocol levels without requiring the other to change.

Figure 5:
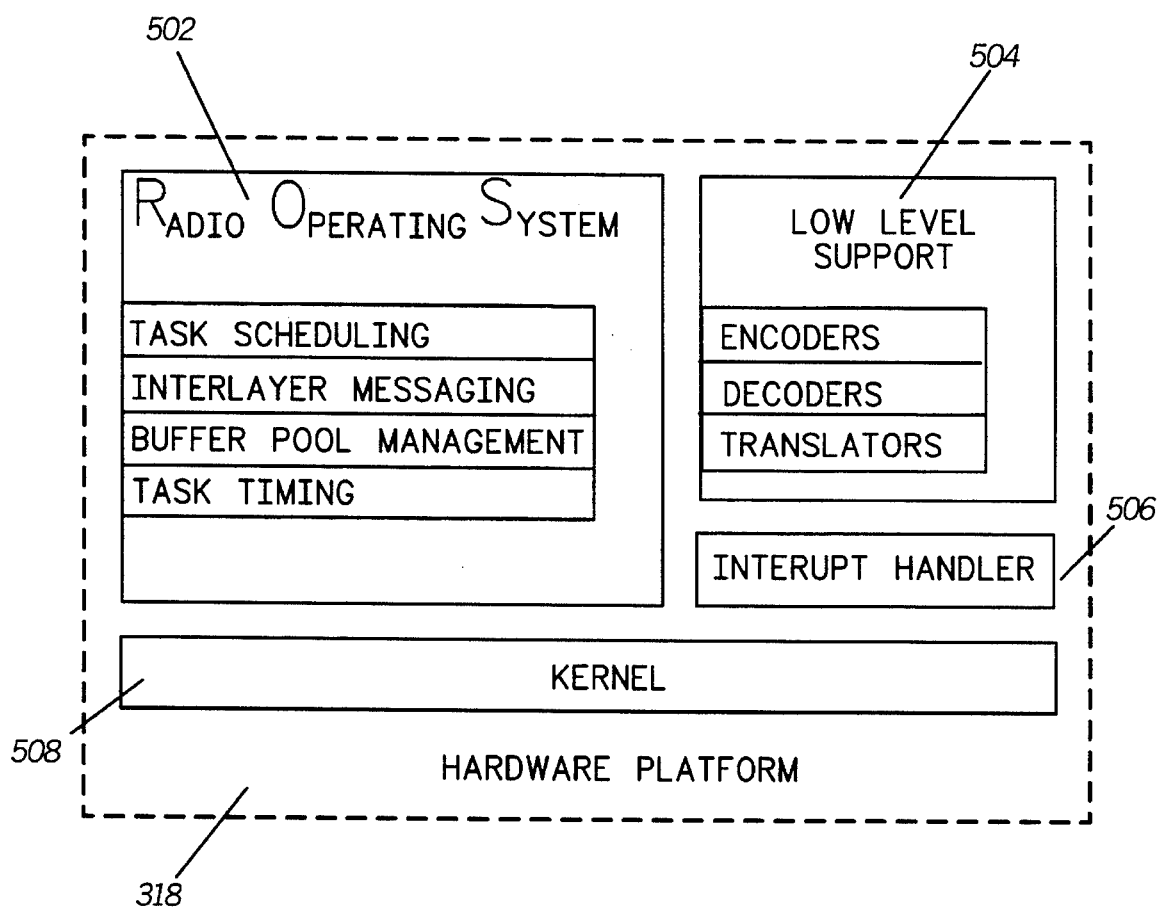
FIG. 5 is a block diagram of the elements of the hardware platform in accordance with the present invention.

FIG. 5 shows the internal elements of the hardware platform 318 in accordance with the present invention. The hardware platform 318 includes four general segments, a radio operating system 502, a low level support 504, an interrupt handler 506, and a kernel 508. These elements work collectively to produce the workings of the hardware platform 318. The kernel 508 is used for providing a kernel and a hardware interface. The kernel 508 performs such functions as partitioning the memory components 210 and 280 to produce a number of buffers or ROM banks. These buffers are used by various components including the microcomputer 11 to perform their functions. The kernel 508 also provides for the scheduling of tasks that are performed by the ergonomics/control means 302 and the feature/protocol means 310. The tasks as performed by the hardware platform 318 are also handled and scheduled by the kernel 508. Handling of messages between the tasks that are running among the ergonomics/control level 302, the feature/protocol level 310 and the hardware platform 318 are also within the responsibility of the Kernel 508. The Kernel 508 includes a buffer pool manager for assigning a buffer from the partition memory device to each of the tasks performed by the three levels 302, 310, and 318. A control handler is also included in the kernel 508 that is intended for the handling of hardware interrupts as they occur. The kernel is also responsible for providing a hardware interface which interfaces the hardware platform 318 to the standardized interface 320. In other words, the hardware interface between the hardware platform 318 and the two levels 302 and 310 is conducted by the kernel 508. As can be seen, the definition of the functions of kernel 508 encompasses a broad range. The definitions of these functions, in the kernel environment and otherwise, are intended to provide an understanding of the operation of the hardware platform

318. It is well understood that minor deviations from these definitions in the handling of tasks outside of the kernel 508 does not depart from the spirit of the present invention and is therefore not to be construed as a limitation.

The radio operating software (ROS) 502 provides support for task scheduling messaging, buffer pool management, task timing, and memory allocation. The ROS 502 determines the scheduling of various tasks conducted by levels 302, 310, and 318. Messages communicated both internal and between the three levels 302, 310, and 318 are also handled by the ROS 502. A buffer pool manager may reside in the ROS 502 to provide assistance to the kernel 508 in its buffer pool management tasks. The low level support 504 includes encoders, decoders, and translators. The encoders are used to encode messages that are transmitted from the hardware platform 318 to the low/intermediate level interface standard 320. The decoders are used to receive information from the interface standard 320 and convert them to a language that the hardware platform 318 "understands". The interrupt handler 506 provides a handling of all interrupts that are common to the operation of the communication device 100.

Those skilled in the art will appreciate that the Kernel 508 may be a subsection of the ROS 502. Many of the functions performed by the ROS 502 may be similarly performed by the kernel 508 and vice versa. The use of a separate block to identify the functions of the kernel 508 provides for an enhanced understanding of the present invention.

Note that although an attempt has been made to define the operation of the various levels 302, 310, 318, in association with various components of the radio communication device 100, it is well understood that some components are used for a number of operations and may not be limited to functioning under any one specific level. An attempt has been made throughout this description of the preferred embodiment to accurately attribute the functionality of each of the levels 302, 310, and 318 with one or more components of the radio 100. Minor and unintentional departures from the core functional attributes may have been encountered. The following paragraph is presented in order to provide a more clear understanding of the interdependence of the various layers and their respective hardware components.

In general, the function calls associated with the display, 160, the keypad 170, and any control; such as the PTT 120 are viewed as being part of the ergonomics/control level 302. Those function calls associated with the encoder 102, the decoder 10, the synthesizer programming 21, and the serial peripheral interface fall into the boundaries of feature/protocol level 310. Other elements provide general functions not attributable to any one level. In view of this summary, it is well understood that the tasks and the function calls performed by each of the levels may utilize any of the components of the device 100. It is the operation of each of these components that may define the ultimate relationship between the layers and the components. It is for this reason that any of the components, protocols, or features may change without requiring change to the others.

It can be demonstrated that a different micro-computer may be used in place of the MC68HC11 by implementing simple changes to the operating program of the serial peripheral interface 18 and the SCI 24. The remainder of the components of the communication device 100 can interface with this new micro-computer so long as the interfaces 304, 314, and 316 and the interface standards 306 and 320 are maintained. Similarly, ergonomics and features of the communication device 100 may change without requiring a significant redesign of the various components. With this scheme, it can be appreciated that no longer a redesign of the entire communication device 100 is necessary in order to meet the requirements of a new product. A significant benefit of the present invention is its design and development time reduction which is achieved by eliminating the need to redesign several different components in order to accommodate changes to only one of those components. Therefore, by structuring the architecture of the communication device 100 in a manner prescribed by the teaching of the present invention, changes may be tolerated on one level without affecting the other levels.

In summary, in one aspect of the present invention, a number of standard interfaces between the various sections of a radio communication device including its hardware platform are defined to prevent design redundancies that are common in present radio communication devices. A set of procedures, methods, and rules, called services have been defined in addition to these interfaces. These procedures, methods, and rules are used by radio designers to develop various radio features and/or user requirements. If the radio features and/or user requirements are developed using these interfaces then the effort to move the features and/or user requirements to a new platform should be limited to developing only services to access the new hardware in a manner compatible with the defined interface standards. Recognizing the uniqueness of user interfaces among radio communication products, these interface standards also define an ergonomic interface to partition the user interface unique code from that code which is common among platforms.

In layering the architecture, the boundary from one level to the next is the set of services and rules defined by interface standards. The software environment defined by these interface standards is based on a priority tasking kernel. The kernel is the Radio Operating System (ROS). This model supports both real-time prioritization of functions and modularity with strict defined interfaces of how the kernel supports task to task communication mechanisms. This provides for a common architecture that can be used for a variety of platforms and ergonomics with very high design efficiency. In other words, the ability to change a layer without affecting another layer significantly contributes to the design simplicity and efficiency.

What is claimed is:

1. A radio frequency communication device having a plurality of operating modes, at least one feature, at least one protocol, and a keypad, the communication device comprising:

a hardware platform including at least a micro-processor and at least a memory device having a predetermined memory_ space and coupled to the micro-processor;

an ergonomics/control means having a first predetermined plurality of tasks that cannot be dynamically altered and each task having a predetermined fixed priority, comprising:

an interpreter for interpreting information entered via the keypad;

a first controller for controlling the features and the plurality of operating modes;

a feature/protocol means having a second predetermined plurality of tasks that cannot be dynamically altered and each task having a predetermined fixed priority, comprising:

means for implementing the features as dictated by the ergonomics/control means;

means for implementing the at least one protocol having means for formulating a desired protocol message;

a hardware means for providing a kernel and a hardware interface having a third predetermined plurality of tasks that cannot be dynamically altered and each task having a predetermined fixed priority, comprising:
  means for partitioning the memory device to produce a plurality of buffers;
  scheduling means for scheduling the first, second, and third plurality of tasks;
  message handler means for handling messages between the first, second, and third plurality of tasks using a buffer from the plurality of buffers;
  a buffer pool manager for assigning a buffer from the plurality of buffers to one of the first, second, and third plurality of tasks;
  an interrupt handler means for handling hardware interrupts;
  hardware interface means coupled to the hardware platform for converting a signal from the hardware platform to a signal having a standardized format;
a high level interface means for providing a first standardized interface between the feature/protocol means and the ergonomics/control means so as to allow preemptive changes to either the feature/protocol means or to the ergonomics/control means without requiring changes to the other;
a low level interface means for providing a second standardized interface between the feature/protocol means and the hardware means so as to allow preemptive changes to either the feature/protocol means or to the hardware means without requiring changes to the other; and
an intermediate level interface means using the second standardized interface to provide preemptive communication between the ergonomics/control means and the hardware means.

2. A radio frequency communication device having a plurality of operating modes, at least one feature, at least one protocol, and a keypad, the communication device comprising:
  a hardware platform including at least one micro-processor;
  an ergonomics/control means having a first predetermined plurality of tasks that cannot be dynamically altered and each task having a predetermined fixed priority, comprising:
    an interpreter for interpreting information entered via the keypad;
    a first controller for controlling the features and the plurality of operating modes;
  a feature/protocol means having a second predetermined plurality of tasks that cannot be dynamically altered and each task having a predetermined fixed priority, comprising:
    means for implementing the features as dictated by the ergonomics/control means;
    means for implementing the at least one protocol having means for formulating a desired protocol message;
  a hardware means for providing a kernel and a hardware interface having a third predetermined plurality of tasks that cannot be dynamically altered and each task having a predetermined fixed priority, comprising:
    an interrupt handler means for handling hardware interrupts;
    hardware interface means coupled to the hardware platform for converting a signal from the hardware platform to a signal having a standardized format;
  a high level interface means for providing a first standardized interface between the feature/protocol means and the ergonomics/control means so as to allow preemptive changes to either the feature/protocol means or to the ergonomics/control means without requiring changes to the other;
  a low level interface means for providing a second standardized interface between the feature/protocol means and the hardware means so as to allow preemptive changes to either the feature/protocol means or to the hardware means without requiring changes to the other; and
  an intermediate interface means using the second standardized interface to provide preemptive communication between the ergonomics/control means and the hardware means.

3. The communication device of claim 2, wherein the at least one micro-processor includes at least one memory device.

4. The communication device of claim 3, wherein the hardware means further includes means for partitioning the memory device to produce a plurality of buffers.

5. The communication device of claim 4, wherein the hardware means further includes a scheduling means for scheduling the first, second, and third plurality of tasks.

6. The communication device of claim 5, wherein the hardware means further includes message handler means for handling messages between the first, second, and third plurality of tasks using a buffer from the plurality of buffers.

7. The communication device of claim 6, wherein the hardware means further includes a buffer pool manager for assigning a buffer from the plurality of buffers to one of the first, second, and third plurality of tasks.

8. A radio frequency communication device having a plurality of operating modes, at least one feature, at least one protocol, and a keypad, the communication device comprising:
  a hardware platform including at least one micro-processor;
  an ergonomics/control means having a first predetermined plurality of tasks that cannot be dynamically altered and each task having a predetermined fixed priority;
  a feature/protocol means having a second predetermined plurality of tasks that cannot be dynamically altered and each task having a predetermined fixed priority;
  a hardware means for providing a kernel and a hardware interface having a third predetermined plurality of tasks that cannot be dynamically altered and each task having a predetermined fixed priority;
  a high level interface means for providing a first standardized interface between the feature/protocol means and the ergonomics/control means so as to allow preemptive changes to either the feature/protocol means or to the ergonomics/control means without requiring changes to the other;
  a low level interface means for providing a second standardized interface between the feature/protocol means and the hardware means so as to allow preemptive changes to either the feature/protocol means or to the hardware means without requiring changes to the other; and
  an intermediate interface means using the second standardized interface to provide preemptive communication between the ergonomics/control means and the hardware means.

9. The radio frequency communication device of claim 8, wherein the ergonomics/control means comprises:

an interpreter for interpreting information entered via the keypad;

a first controller for controlling the features and the plurality of operating modes.

10. The radio frequency communication device of claim 8, wherein the feature/protocol means comprises:

means for implementing the features as dictated by the ergonomics/control means;

means for implementing the at least one protocol having means for formulating a desired protocol message.

11. The radio frequency communication device of claim 8, wherein the hardware means comprises:

means for partitioning the memory device to produce a plurality of buffers;

scheduling means for scheduling the first, second, and third plurality of tasks;

message handler means for handling messages between the first, second, and third plurality of tasks using a buffer from the plurality of buffers;

a buffer pool manager for assigning a buffer from the plurality of buffers to one of the first, second, and third plurality of tasks;

an interrupt handler means for handling hardware interrupts;

hardware interface means coupled to the hardware platform for converting a signal from the hardware platform to a signal having a standardized format.

12. A radio frequency communication device having a plurality of operating modes, at least one feature, at least one protocol, and a keypad, the communication device comprising:

a hardware platform including at least one micro-processor;

an ergonomics/control means having a first predetermined plurality of tasks that cannot be dynamically altered and each task having a predetermined fixed priority;

a feature means having a second predetermined plurality of tasks that cannot be dynamically altered and each task having a predetermined fixed priority;

a protocol means having a third predetermined plurality of tasks that cannot be dynamically altered and each task having a predetermined fixed priority;

a hardware means for providing a kernel and a hardware interface having a fourth plurality of tasks;

a high level interface means for providing a first standardized interface between the feature means and the ergonomics/control means so as to allow changes to either the feature/protocol means or to the ergonomics/control means without requiring changes to the other;

a first intermediate level interface means for providing a second standardized interface between the protocol means and the feature means so as to allow preemptive changes to either the protocol means or to the feature means without requiring changes to the other;

a low level interface means for providing a third standardized interface between the protocol means and the hardware means so as to allow preemptive changes to either one of the two protocol means or the hardware means without requiring changes to the other; and a second intermediate level interface means using the third standardized interface to provide preemptive communication between the ergonomics/control means and the hardware means.

* * * * *